(12) United States Patent
Wong et al.

(10) Patent No.: US 10,505,442 B2
(45) Date of Patent: Dec. 10, 2019

(54) SYNCHRONOUS RECTIFICATION CONTROL CIRCUIT, METHOD AND FLYBACK SWITCH CIRCUIT

(71) Applicant: JOULWATT TECHNOLOGY (HANGZHOU) CO., LTD., Hangzhou (CN)

(72) Inventors: Pitleong Wong, Hangzhou (CN);
Yuancheng Ren, Hangzhou (CN);
Xunwei Zhou, Hangzhou (CN);
Junming Zhang, Hangzhou (CN);
Yiqing Jin, Hangzhou (CN)

(73) Assignee: JOULWATT TECHNOLOGY (HANGZHOU) CO., LTD., Hangzhou (CN)

( * ) Notice: Subject to any disclaimer, the term of this patent is extended or adjusted under 35 U.S.C. 154(b) by 175 days.

(21) Appl. No.: 15/719,514

(22) Filed: Sep. 28, 2017

(65) Prior Publication Data
US 2018/0091040 A1    Mar. 29, 2018

(30) Foreign Application Priority Data

Sep. 28, 2016  (CN) .......................... 2016 1 0855157

(51) Int. Cl.
| | | |
|---|---|---|
| *H03B 1/00* | (2006.01) | |
| *H03K 3/00* | (2006.01) | |
| *H02M 1/38* | (2007.01) | |
| *H02M 1/08* | (2006.01) | |
| *H02M 7/217* | (2006.01) | |
| *H03K 5/24* | (2006.01) | |
| *H02M 1/00* | (2006.01) | |

(52) U.S. Cl.
CPC ............... *H02M 1/38* (2013.01); *H02M 1/08* (2013.01); *H02M 7/217* (2013.01); *H03K 5/24* (2013.01); *H02M 2001/0048* (2013.01)

(58) Field of Classification Search
CPC ................................... H02M 1/38; H02M 1/08
USPC ....................................... 363/21.14; 327/109
See application file for complete search history.

(56) References Cited

U.S. PATENT DOCUMENTS

2016/0190942 A1* 6/2016 Kikuchi ............ H02M 3/33507
                                                              363/21.14

* cited by examiner

*Primary Examiner* — Metasebia T Retebo
(74) *Attorney, Agent, or Firm* — Muncy, Geissler, Olds & Lowe, P.C.

(57) ABSTRACT

The present invention provides a synchronous rectification control circuit, a method and a flyback switching circuit. A drive circuit outputs a drive signal to control the turn-on and turn-off of a synchronous rectification transistor; a threshold comparison circuit controls the drive circuit to output a pull-up drive signal to turn on the synchronous rectification transistor when a drain-source voltage is lower than a preset low threshold voltage and controls the drive circuit to output a pull-down drive signal to turn off the synchronous rectification transistor when the drain-source voltage is higher than or equal to a preset high threshold voltage; a voltage regulation control circuit controls the drive circuit to output a drive signal for pulling up a voltage of the drive signal to a preset pull-up voltage high value when the drain-source voltage is lower than a preset voltage regulation reference value.

10 Claims, 4 Drawing Sheets

SYNCHRONOUS RECTIFICATION CONTROL CIRCUIT, METHOD AND FLYBACK SWITCH CIRCUIT

CROSS-REFERENCE TO RELATED APPLICATIONS

This Non-provisional application claims priority under 35 U.S.C. § 119(a) on Patent Application No(s). 201610855157.1 filed in People's Republic of China on Sep. 28, 2016, the entire contents of which are hereby incorporated by reference.

BACKGROUND OF THE INVENTION

Field of the Invention

The present invention relates to switching-mode power supply technology and, more particularly, to a synchronous rectification control circuit, a method, and a flyback switching circuit.

Description of the Related Art

FIG. 1 is a flyback circuit, which is a common isolated type switching circuit. A primary side N01 of a transformer TR1 is connected with a primary circuit, and an input voltage Vin1 is inputted into a primary circuit. An output current Vout1 flows through a diode D01 at a secondary side N02, the output current Vout1 is loaded to a load, and the load is connected in parallel with a capacitor C01. As the function of electrical equipment increases, the power supply thereof needs to be increased. That is, the switching-mode power supply needs to provide a larger output current for the electrical equipment.

In order to improve the conversion efficiency of a switch power supply, a synchronous rectification metal oxide semiconductor (MOS) tube is used to replace the diode. Referring to FIG. 2, the freewheeling diode D01 at the secondary side in FIG. 1 is replaced by a synchronous rectification transistor M11. In detail, $V_{in2}$ is inputted into a primary side N11 of a transformer TR2, the primary side is connected with a main switching tube M10, and the turn-on and turn-off of the main switching tube M10 make an input current $i_{p2}$ change, allowing a secondary side N12 to generate an output current $i_{s2}$ and generate an output voltage $V_{out2}$ correspondingly. The source of the synchronous rectification transistor M11 is connected with a secondary side winding, the drain is connected with one end of a load, and the other end of the load is grounded. The load is further connected in parallel with a capacitor C11, and a freewheeling diode D11 is also connected between the source and the drain of the synchronous rectification transistor M11. In a non-isolated type switching circuit, a drive circuit of a synchronous rectification MOS tube can easily obtain a switching signal of a main switching tube. Thus, the control of synchronous rectification is relatively easy. However, in the isolated type switching circuit in FIG. 2, it is difficult to obtain the switching signal of the main switching tube M10 under the control of the synchronous rectification MOS tube M11. Hence, it is easy to cause the phenomenon that the synchronous rectification transistor M11 and the main switching tube M10 are simultaneously turned on or the fact that the synchronous rectification transistor M11 is only turned on in a partial freewheeling stage, resulting in a not high system efficiency. Therefore, the current synchronous rectification control of the synchronous rectification transistor is a challenge.

BRIEF SUMMARY OF THE INVENTION

The present invention provides a synchronous rectification control circuit, a method, and a flyback switch circuit, greatly accelerating the turn-off speed of a synchronous rectification transistor, preventing the direct connection with a main switching tube at a primary side, and improving the reliability of the system.

To solve the above problems, this invention provides a synchronous rectification control circuit for controlling a switch circuit having a synchronous rectification transistor, and the control circuit includes:

a drive circuit, an output end thereof being connected with a driving end of the synchronous rectification transistor, the drive circuit outputting a drive signal to control turn-on and turn-off of the synchronous rectification transistor;

a threshold comparison circuit, an input end thereof receives a drain-source voltage of the synchronous rectification transistor, and wherein when the drain-source voltage is lower than a preset low threshold voltage, a pull-up drive signal is outputted to turn on the synchronous rectification transistor; and when the drain-source voltage is higher than or equal to a preset high threshold voltage, the drive circuit is controlled to output a pull-down drive signal to turn off the synchronous rectification transistor; and a voltage regulation control circuit, collecting the drain-source voltage of the synchronous rectification transistor and comparing the drain-source voltage to a preset voltage regulation reference value, wherein when the drain-source voltage is lower than the preset voltage regulation reference value, the drive circuit is controlled to output a drive signal for pulling up a voltage of the drive signal to a preset pull-up voltage high value, and when the drain-source voltage is higher than or equal to the preset voltage regulation reference value and lower than the preset high threshold voltage, the drive circuit is controlled to enter a voltage regulation state, a voltage of the drive signal is regulated, and the drive signal after being voltage regulated is outputted, such that the drain-source voltage is stable at the preset voltage regulation reference value or around the preset voltage regulation reference value.

According to one embodiment of the present invention, when turn-on time of the synchronous rectification transistor reaches a certain value or within a certain period before the synchronous rectification transistor is turned off, if the drive circuit does not enter the voltage regulation state, the voltage regulation control circuit may output a dynamic regulation signal.

According to one embodiment of the present invention, the synchronous rectification control circuit may further include a dynamic voltage regulation circuit connected with the voltage regulation control circuit, and receiving and responding to the dynamic regulation signal outputted by the voltage regulation control circuit, the dynamic voltage regulation circuit may regulate the preset voltage regulation reference value and output the preset voltage regulation reference value after being regulated to the voltage regulation control circuit.

According to one embodiment of the present invention, the voltage regulation control circuit may include a recording module for recording a previous turn-on time T1 of the synchronous rectification transistor. When the turn-on time of the synchronous rectification transistor is controlled to reach N*T1, if the drive circuit does not enter the voltage regulation state, the dynamic regulation signal may be outputted, wherein N is a percentage value.

According to one embodiment of the present invention, the voltage regulation control circuit may include a detection module for detecting the time when the drive circuit is in the voltage regulation state.

According to one embodiment of the present invention, the synchronous rectification control circuit may further include a dynamic voltage regulation circuit connected with the voltage regulation control circuit. According to the time when the drive circuit is in the voltage regulation state obtained by the detection module, the dynamic voltage regulation circuit may regulate the preset voltage regulation reference value to make the time when the drive circuit is in the voltage regulation state equal to or close to a certain value.

According to one embodiment of the present invention, the threshold comparison circuit may include:

a first comparator, wherein a negative input end of the first comparator may receive the drain-source voltage outputted by the voltage regulation control circuit, a positive input end of the first comparator may be inputted with the preset low threshold voltage, and an output end of the first comparator may output a first comparison signal;

a second comparator, wherein a positive input end of the second comparator may receive the drain-source voltage outputted by the voltage regulation control circuit, a negative input end of the second comparator may be inputted with the preset high threshold voltage, and an output end of the second comparator may output a second comparison signal; and a trigger, receiving the first comparison signal and the second comparison signal, outputting a first control signal and control the drive circuit to output the pull-up drive signal when the first comparison signal is at a high level, and outputting a second control signal and controlling the drive circuit to output the pull-down drive signal when the second comparison signal is at a high level.

The invention further provides a synchronous rectification control method for controlling a switching circuit having a synchronous rectification transistor, the control method includes the following steps:

collecting a drain-source voltage of the synchronous rectification transistor;

comparing the drain-source voltage to a preset low threshold voltage and controlling a drive circuit to output a pull-up drive signal to turn on the synchronous rectification transistor when the drain-source voltage is lower than the preset low threshold voltage;

comparing the drain-source voltage to a preset voltage regulation reference value, controlling the drive circuit to output a drive signal for pulling up a voltage of the drive signal when the drain-source voltage is lower than the preset voltage regulation reference value, and when the drain-source voltage is higher than or equal to the preset voltage regulation reference value and lower than a preset high threshold voltage, controlling the drive circuit to enter a voltage regulation state, regulating a voltage of the drive signal, and outputting the drive signal after being voltage regulated, such that the drain-source voltage is stable at the preset voltage regulation reference value or around the preset voltage regulation reference value; and comparing the drain-source voltage to the preset high threshold voltage and controlling the drive circuit to output a pull-down drive signal to turn off the synchronous rectification transistor when the drain-source voltage is higher than or equal to the preset high threshold voltage.

According to one embodiment of the present invention, the synchronous rectification control method may further include lowering the preset voltage regulation reference value if the drive circuit does not enter the voltage regulation state when turn-on time of the synchronous rectification transistor reaches a certain value or within a certain period before the synchronous rectification transistor is turned off.

According to one embodiment of the present invention, the previous turn-on time T1 of the synchronous rectification transistor may be recorded, and when the turn-on time of the synchronous rectification transistor is controlled to reach N*T1, if the drive circuit does not enter the voltage regulation state, the preset voltage regulation reference value may be lowered, wherein N is a percentage value.

According to one embodiment of the present invention, the synchronous rectification control method may further include detecting time when the drive circuit is in the voltage regulation state and regulating the preset voltage regulation reference value to make the time equal to or close to a certain value.

The present invention also provides a flyback switching circuit including the synchronous rectification control circuit according to any of the preceding embodiments or configured to use the synchronous rectification control method as described in any of the preceding embodiments.

Adopting the above-mentioned technical solutions, the present invention has the following beneficial effects compared with the prior art.

In the case where a switching signal of a main switching tube is not required, the circuit can either work in a current discontinuous conduction mode or in a current continuous conduction mode. By dynamically regulating the driving voltage of the synchronous rectification transistor, the synchronous rectification transistor can be ensured to be turned off from a relatively low voltage value, thereby greatly accelerating the turn-off speed, preventing the direct connection with the main switching tube at a primary side, and improving the reliability of the system. The acceleration of the turn-off speed can also reduce a reverse current of a secondary side current and reduce a voltage spike of an metal oxide semiconductor (MOS) switching tube, such that the MOS tube with a lower withstand voltage can be used and component costs are saved.

In addition, in a period of time before the synchronous rectification transistor is turned off, whether the drive signal is in the voltage regulation state is checked, or the time of the voltage regulation state is allowed to be maintained at a constant value, which can ensure that the synchronous rectification transistor can always be turned on even if the circuit is in the current continuous conduction mode and the current is relatively large, thereby reducing conduction losses and improving the efficiency of the system.

DETAILED DESCRIPTION OF THE INVENTION

The above objectives, features, and advantages of the present invention will become better understood from the following detailed description of the specific embodiments of the present invention with reference to the accompanying drawings.

A number of specific details are set forth in the following description to facilitate a thorough understanding of the present invention. It is to be understood that the invention may be practiced in many other ways as described herein, and those skilled in the art can make similar generalization without departing from the spirit of this invention. Thus, the invention is not limited to the specific embodiments disclosed below.

Figure 1:
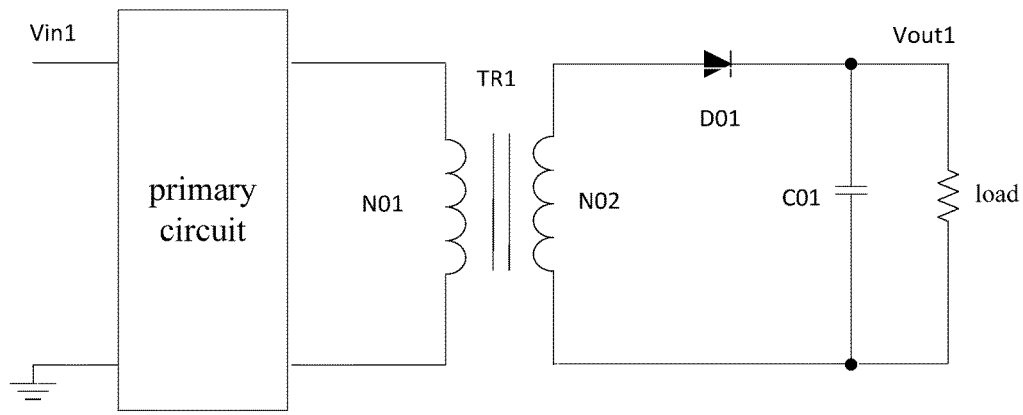
FIG. 1 is a schematic diagram of a circuit configuration illustrating a switching circuit according to an embodiment of the prior art.
Figure 2:
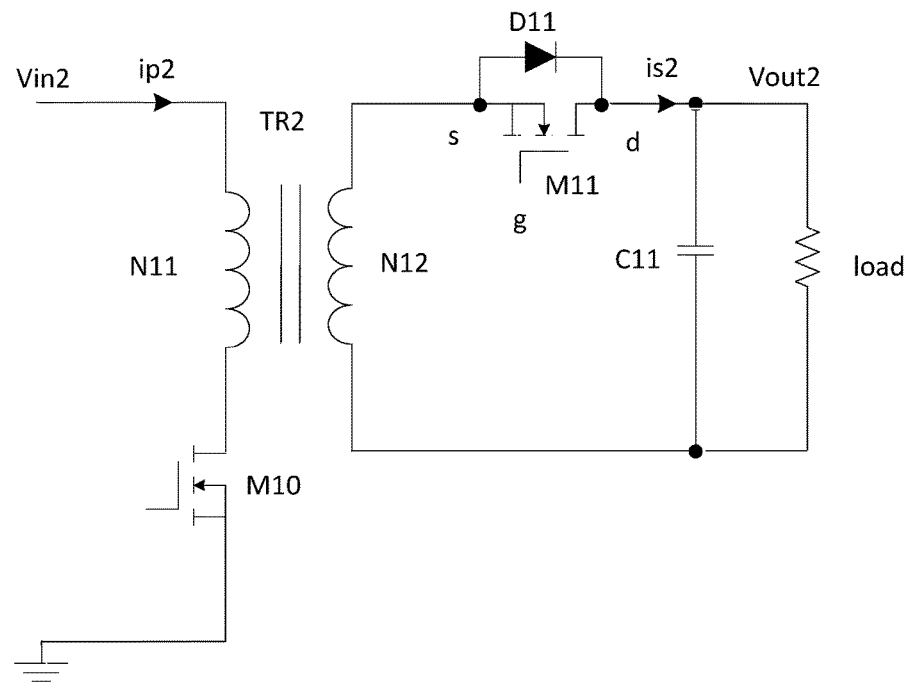
FIG. 2 is a schematic diagram of a circuit configuration illustrating a switching circuit according to another embodiment of the prior art.
Figure 3:
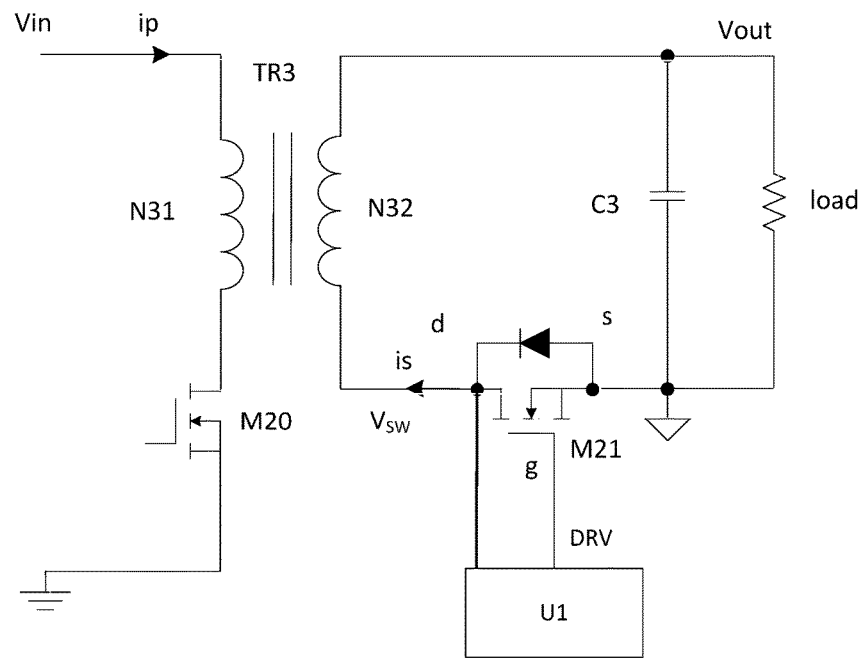
FIG. 3 is a schematic diagram of a circuit configuration illustrating a switching circuit according to an embodiment of the present invention.

A synchronous rectification control circuit in the embodiment of the present invention is used for controlling a switching circuit having a synchronous rectification transistor. FIG. 3 illustrates a switching circuit of an embodiment including: a transformer TR3, one end of a primary side winding N31 of a transformer TR3 receiving an input voltage $V_{in}$, and an input current $i_p$ flowing through the winding N31; a main switching tube M20, the drain of the main switching tube M20 connected with the other end of the primary side winding N31 of the transformer TR3, the source of the main switching tube M20 being grounded, and the gate of the main switching tube M20 receiving a main drive signal; one end of a secondary side winding N32 of the transformer TR3 outputting an output voltage $V_{out}$ and this end connected with one end of a load; the load, the other end of the load being grounded; a synchronous rectification transistor M21, the source of the synchronous rectification transistor M21 and the other end of the load being connected by common grounding, the drain of the synchronous rectification transistor M21 connected with the other end of the secondary side winding N32 of the transformer TR3, and the gate of the synchronous rectification transistor M21, as a driving terminal, receiving a drive signal DRV outputted by a synchronous rectification control circuit U1. However, the form of the switching circuit is not limited thereto, and other circuits having synchronous rectification transistors to achieve the synchronous rectification function are all applicable. For example, the switching circuit in FIG. 2 is also applicable.

In the present embodiment, the source of the synchronous rectification transistor M21 and the load are connected by common grounding, such that the synchronous rectification control circuit and the output of the source of the synchronous rectification transistor M21 are commonly grounded thus to control the synchronous rectification transistor M21 conveniently.

The synchronous rectification transistor M21 and the main switching tube M20 in the present embodiment are preferably metal oxide semiconductor (MOS) transistors and more specifically are N-metal oxide semiconductor (NMOS) transistors. However, the synchronous rectification transistor M21 and the main switching tube M20 can also be switching tubes of other types, such as transistors, thyristors, and switching tubes formed by connecting a plurality of the aforementioned tubes.

Continue to refer to FIG. 3. A freewheeling diode can be connected in parallel with the synchronous rectification transistor M21, the positive end of the freewheeling diode is connected with the source of the synchronous rectification transistor, and the negative end of the freewheeling diode is connected with the drain of the synchronous rectification transistor M21. The freewheeling diode can be an parasitic diode of the synchronous rectification transistor M21 and can also be an additional diode, the details of which are not limit. After the main switching tube M20 is turned off, the freewheeling diode connected in parallel with the synchronous rectification transistor M21 is turned on.

Figure 4:
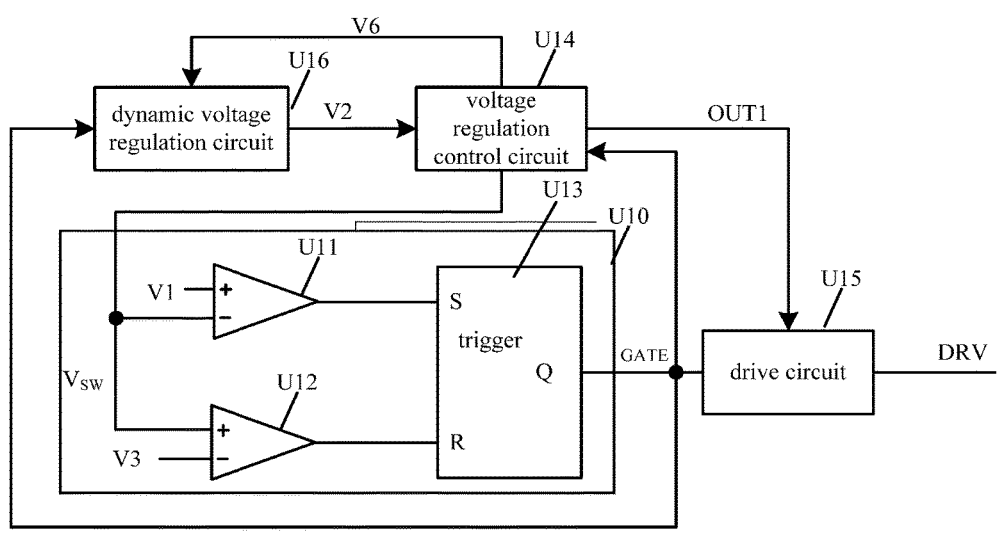
FIG. 4 is a schematic diagram of a circuit configuration illustrating a synchronous rectification control circuit according to an embodiment of the present invention.

Referring to FIG. 3 and FIG. 4, the synchronous rectification control circuit U1 includes a drive circuit U15, a threshold comparison circuit U10, and a voltage regulation control circuit U14.

The voltage regulation control circuit U14 collects a drain-source voltage $V_{SW}$ of the synchronous rectification transistor M21. The collected drain-source voltage $V_{SW}$ is reserved and can be inputted to the threshold comparison circuit U10, and the drain-source voltage $V_{SW}$ is the voltage between the drain d and the source s of the synchronous rectification transistor M21. After the main switching tube M20 is turned off, the freewheeling diode is turned on.

The input end of the threshold comparison circuit U10 can receive the drain-source voltage $V_{SW}$ of the synchronous rectification transistor M21 through a voltage regulation controller. When the drain-source voltage $V_{SW}$ is lower than a preset low threshold voltage V1, the drive circuit U15 is controlled to pull up the voltage value of the drive signal DRV, and the pull-up drive signal DRV is outputted, thereby allowing the synchronous rectification transistor M21 to be turned on. The preset low threshold voltage V1 may be, for example, −300 mV. However, this is only an example, and the specific value is not limited and can be preset as needed. This preset low threshold voltage V1 can enable the pull-up driving function of the drive circuit U15.

The voltage regulation control circuit U14 compares the drain-source voltage $V_{SW}$ to a preset voltage regulation reference value V2. When the drain-source voltage $V_{SW}$ is lower than the preset voltage regulation reference value V2, the drive circuit is controlled to pull up the drive signal DRV and up to a preset pull-up voltage high value, and the drive signal DRV after being continuously pulled up is outputted. The synchronous rectification transistor M21 is still turned on due to the pull up. The preset pull-up voltage high value is preferably the maximum voltage capable of pulling up, such as 12V. However, this is only an example. When the drain-source voltage $V_{SW}$ is higher than or equal to the preset voltage regulation reference value V2 and lower than a preset high threshold voltage V3, the drive circuit U15 is controlled to enter a voltage regulation state, the voltage of the drive signal DRV is regulated, and the drive signal DRV after being voltage regulated is outputted, such that the drain-source voltage $V_{SW}$ is stable at the preset voltage regulation reference value V2 or around the preset voltage regulation reference value V2. Thus, the voltage of the drive signal DRV approaches a gate turn-off threshold voltage of the synchronous rectification transistor M21 before the synchronous rectification transistor M21 is turned off. Since the voltage of the drive signal DRV approaches the gate turn-off threshold voltage before the turn-off, the synchronous rectification transistor M21 can be quickly turned off.

The preset voltage regulation reference value V2 can be preset, and the value can be set to allow the voltage of the drive signal DRV to be around the gate turn-off threshold voltage before the turn-off. For example, the value may be −60 mV. However, this is just an example.

The preset low threshold voltage V1, the preset voltage regulation reference value V2, and the preset high threshold voltage V3 are all negative voltages, and the preset low threshold voltage V1<the preset voltage regulation reference value V2<the preset high threshold voltage V3.

When the drain-source voltage $V_{SW}$ is higher than or equal to the preset high threshold voltage V3, the threshold comparison circuit U10 controls the drive circuit U15 to pull down the drive signal DRV, preferably down to zero, and output a pull-down drive signal to turn off the synchronous rectification transistor M21. Due to the voltage regulation control of the voltage regulation control circuit U14, the voltage of the drive signal DRV is around the gate turn-off threshold voltage, such that the synchronous rectification transistor M21 is quickly turned off. The preset high threshold voltage V3 may be, for example −10 mV. However, this is only an example, and the specific value is not limited and can be preset as needed.

The two input ends of the drive circuit U15 are connected with the output end of the threshold comparison circuit U10 and the output end of the voltage regulation control circuit U14, respectively, and are controlled by the threshold comparison circuit U10 and the output end of the voltage regulation control circuit U14. The output end of the drive circuit U15 is connected with the driving end of the synchronous rectification transistor M21 (i.e., the gate of the synchronous rectification transistor), and the drive signal DRV is outputted to control the turn-on and turn-off of the synchronous rectification transistor M21.

The switching-mode power supply having the synchronous rectification transistor M21 can either work in a current discontinuous conduction mode or in a current continuous conduction mode. By dynamically regulating the voltage of the drive signal DRV of the synchronous rectification transistor M21, the synchronous rectification transistor can be ensured to be turned off from a relatively low voltage value, thereby greatly accelerating the turn-off speed, preventing the direct connection with the main switching tube M20 at the primary side, and improving the reliability of the system. The acceleration of the turn-off speed can also reduce a reverse current of a secondary side current $i_S$ and reduce a voltage spike of the MOS switching tube, such that the MOS tube with a lower withstand voltage can be used and component costs are saved.

In one embodiment, when the turn-on time of the synchronous rectification transistor M21 reaches a certain value or within a certain period T2 before the synchronous rectification transistor M21 is turned off, if the drive circuit does not enter the voltage regulation state, the voltage regulation control circuit U14 outputs a dynamic regulation signal. It is possible to determine whether the drive circuit U15 enters the voltage regulation state or not by clocking the turn-on time of the synchronous rectification transistor M21 by a timing circuit or by presetting to be within a certain period of time T2 before the turn-off. The judgment of the state can be determined in accordance with the comparison result outputted by the voltage regulation control circuit U14. Continue to refer to FIG. 4. The synchronous rectification control circuit U1 further includes a dynamic voltage regulation circuit U16, connected with the voltage regulation control circuit U14. Receiving and responding to the dynamic regulation signal outputted by the voltage regulation control circuit U14, the dynamic voltage regulation circuit U16 regulates the preset voltage regulation reference value V2 and outputs the preset voltage regulation reference value V2 after being regulated to the voltage regulation control circuit U14. It is preferable to lower the preset voltage regulation reference value V2 to a certain value, such that the voltage of the drive signal DRV exits the state of being pulled up to the preset pull-up voltage high value and enters the voltage regulation state of the drive signal DRV. Thus, the synchronous rectification transistor M21 can be quickly turned off as the voltage of the drive signal DRV is around the gate turn-off threshold voltage before the turn-off.

The voltage regulation control circuit U14 can be implemented by the combination of a voltage comparison circuit, a timing circuit and other conventional circuits. The voltage comparison circuit compares the drain-source voltage $V_{SW}$ with the preset voltage regulation reference value V2, and the comparison result is used for controlling the output voltage of the drive circuit U15 (the drive signal DRV). The timing circuit clocks the time when the drive circuit U15 is in the voltage regulation state and controls the dynamic voltage regulation circuit U16 so as to accordingly regulate the output voltage of the dynamic voltage regulation circuit U16, i.e., the preset voltage regulation reference value V2. The drive circuit U15 adopts the drive circuit capable of achieving the voltage regulation output function, and the details will not be described herein.

Preferably, the voltage regulation control circuit U14 includes a recording module for recording the previous turn-on time T1 of the synchronous rectification transistor M21, and when the turn-on time of the synchronous rectification transistor M21 is controlled to reach N*T1, if the drive circuit U15 does not enter the voltage regulation state, the dynamic regulation signal is outputted, wherein N is a percentage value, for example N is equal to but not limited to 70%.

In another embodiment, the voltage regulation control circuit U14 includes a detection module for detecting time Ta when the drive circuit U15 is in the voltage regulation state. The time Ta when the drain source voltage $V_{SW}$ is equal or close to the preset voltage regulation reference value V2 outputted by the dynamic voltage regulation circuit U16 can be obtained as long as the comparison result of the voltage regulation control circuit U14 is detected and timed. The synchronous rectification control circuit U1 further includes the dynamic voltage regulation circuit (please refer to FIG. 4), connected with the voltage regulation control circuit U14. According to the time when the drive circuit is in the voltage regulation state, the dynamic voltage regulation circuit regulates the preset voltage regulation reference value V2 to make the time when the drive circuit is in the voltage regulation state equal to or close to a certain value T3. That is, when the time Ta is smaller than the value T3, the value of the preset voltage regulation reference value V2 is decreased; and when the time Ta is bigger than the value T3, the value of the preset voltage regulation reference value V2 is increased. The value T3 can be preset as desired.

Within a period of time before the synchronous rectification transistor M21 is turned off, whether the drive signal DRV is in the voltage regulation state is checked, or the time of the voltage regulation state is allowed to be maintained at a constant value, which can ensure that the synchronous rectification transistor can always be turned on even if the circuit is in the current continuous conduction mode and the current is relatively large, thereby reducing conduction losses and improving the efficiency of the system.

Take the circuit configuration as shown in FIG. 4 for example. In detail, the threshold comparison circuit U10 may include a first comparator U11, a second comparator U12, and a trigger U13. A negative input end of the first comparator U11 receives the drain-source voltage $V_{SW}$, a positive input end of the first comparator U11 is inputted with the preset low threshold voltage V1, and an output end of the first comparator U11 outputs a first comparison signal. A positive input end of the second comparator U12 receives the drain-source voltage $V_{SW}$ outputted by the voltage regulation control circuit U14, a negative input end of the second comparator U12 is inputted with the preset high threshold voltage V3, and an output end outputs a second comparison signal. A trigger U13 receives the first comparison signal and the second comparison signal, outputs a first control signal and controls the drive circuit U15 to output the pull-up drive signal when the first comparison signal is at a high level, and outputs a second control signal and controls the drive circuit to output the pull-down drive signal when the second comparison signal is at a high level.

Optionally, the trigger U13 is an RS trigger. After the main switching tube M20 is turned off, the freewheeling diode connected in parallel with the synchronous rectification transistor M21 is turned on. When the drain-source voltage $V_{SW}$ is lower than the preset low threshold voltage V1, the output of the first comparator U11 changes from low to high. That is, the setting terminal S of the RS trigger is high, the clear terminal R is low, and the output terminal Q of the RS trigger is high. The output terminal Q of the RS trigger is connect to one input end of the drive circuit U15 to control the drive circuit U15 to generate the pull-up drive signal DRV. When the current of the synchronous rectification transistor M21 is further decreased and the drain-source voltage $V_{SW}$ is raised to the preset high threshold voltage V3, the output of the second comparator U12 changes from low to high, the clear terminal R changes from low to high, the setting terminal S is low, and the output terminal Q is low. That is, the drive signal DRV outputted by the drive circuit U15 is controlled to become low, and the synchronous rectification transistor M21 is turned off.

The working principle of the synchronous rectification control circuit is described in detail hereinafter. After the main switching tube M20 is turned off, the freewheeling diode connected in parallel with the synchronous rectification transistor M21 is turned on. When the drain-source voltage $V_{SW}$ is lower than the preset low threshold voltage V1, the output of the first comparator U11 changes from low to high. That is, the setting terminal S of the RS trigger is high, the clear terminal R is low, the output terminal Q of the RS trigger is high, and the output terminal Q of the RS trigger is connected to one input end of the drive circuit U15 to control the drive circuit U15 to generate the pull-up drive signal DRV. The output voltage of the dynamic voltage regulation circuit U16 is the preset voltage regulation reference value V2 which is initially set to a preset value (e.g., −60 mV) and is inputted into the voltage regulation control circuit U14, and the drain-source voltage $V_{SW}$ is also the input of the voltage regulation control circuit U14. The voltage regulation control circuit U14 compares the preset voltage regulation reference value V2 outputted by the dynamic voltage regulation circuit U16 to the drain-source voltage $V_{SW}$, and when the drain-source voltage $V_{SW}$ is lower than the preset voltage regulation reference value V2 (e.g., −60 mV), the voltage regulation control circuit U14 controls the drive circuit U15 to pull up the drive signal DRV to the maximum voltage (e.g., 12V); when the drain-source voltage $V_{SW}$ is higher than or equal to the preset voltage regulation reference value V2, the voltage regulation control circuit U14 controls the drive circuit U15 to make the drive circuit U15 regulate the drive signal DRV, such that the drain-source voltage $V_{SW}$ is stable around the preset voltage regulation reference value V2, that is, the drive signal DRV is in the voltage regulation state; the voltage regulation control circuit U14 records the previous turn-on time T1 of the synchronous rectification transistor in the previous switching record, and at the time T2 (e.g., 1 us) before the turn-off of the synchronous rectification transistor M21, or when the turn-on time of the synchronous rectification transistor M21 reaches N*T1 (e.g., N=70%), if the voltage regulation control circuit U14 does not control the drive circuit U15 to be in the voltage regulation state of the drive signal DRV, the voltage regulation control circuit U14 controls the dynamic voltage regulation circuit U16 to make the preset voltage regulation reference value V2 lower to a certain value, such that the voltage regulation control circuit U14 controls the drive circuit U15 to enter the voltage regulation state of the drive signal DRV. When the current of the synchronous rectification transistor M21 is further decreased and the drain-source voltage $V_{SW}$ is raised up to the preset high threshold voltage V3, the output of the second comparator U12 changes from low to high, the clear terminal R changes from low to high, the setting terminal S is low, and the output terminal Q is low. That is, the drive signal DRV outputted by the drive circuit U15 is controlled to become low, and the synchronous rectification transistor M21 is turned off.

Figure 5:
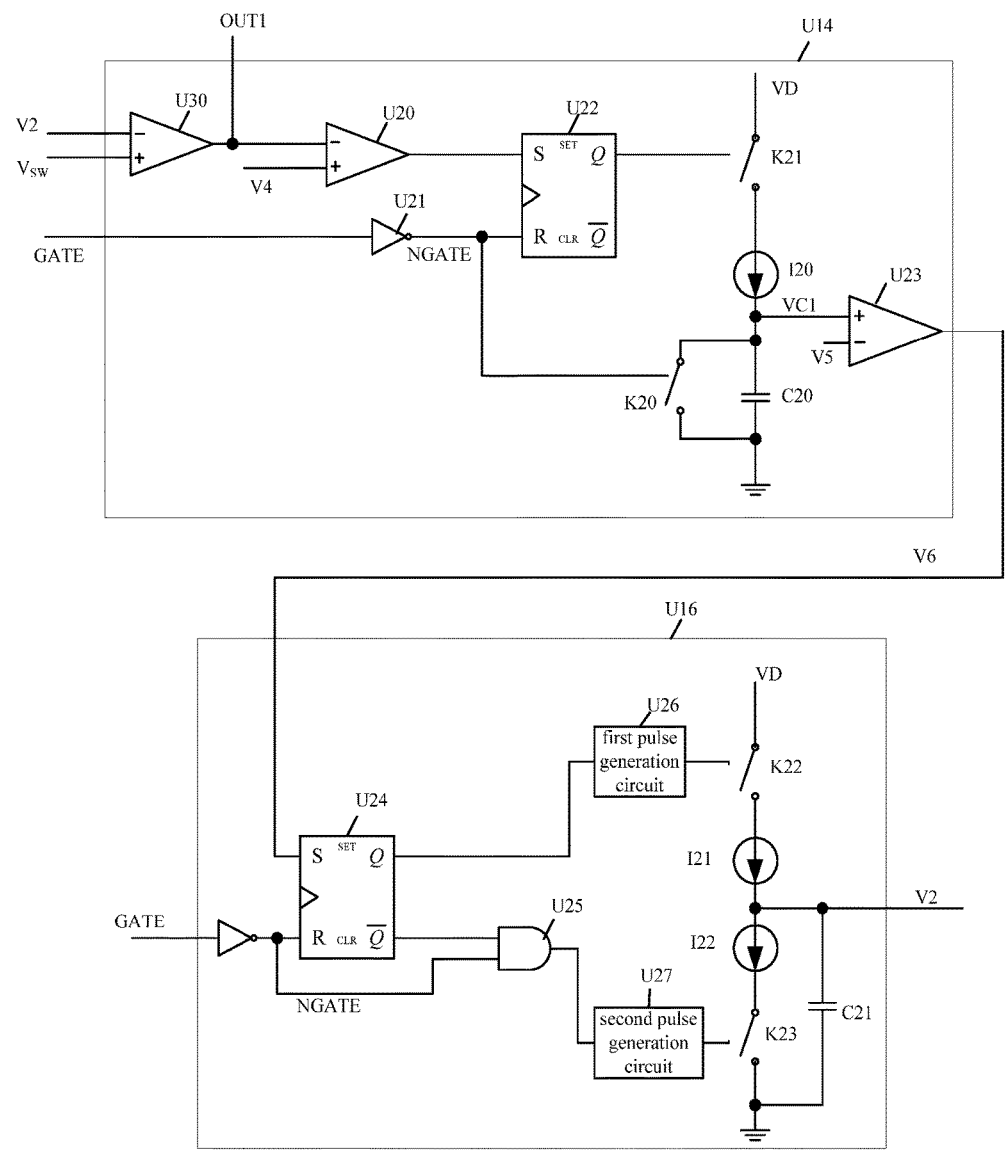
FIG. 5 is a schematic diagram of a circuit configuration illustrating a voltage regulation control circuit and a dynamic voltage regulation circuit according to an embodiment of the present invention.

Referring to FIG. 5, in one embodiment, the voltage regulation control circuit U14 includes an operational amplifier (OPAMP) U30. A first input end of the operational amplifier U30 receives the drain-source voltage $V_{SW}$, a second input end of the operational amplifier U30 receives the preset voltage regulation reference value V2, and an output end of the operational amplifier U30 outputs an OPAMP output level OUT1 to the drive circuit U15 thus to regulate the drive signal DRV. When the drain-source voltage $V_{SW}$ is smaller than the preset voltage regulation reference value V2, the OPAMP output level OUT1 is pulled up to the maximum value to control the drive circuit U15 to output the drive signal for pulling up the voltage of the drive signal to the preset pull-up voltage high value; when the drain-source voltage $V_{SW}$ is higher than the preset voltage regulation reference value V2, the OPAMP output level OUT1 is pulled down to pull down the drive signal DRV so as to lower the drain-source voltage $V_{SW}$, such that the closed-loop feedback is formed to regulate the drain-source voltage $V_{SW}$ to be stable at the preset voltage regulation reference value V2 or around the preset voltage regulation reference value V2.

Further, the voltage regulation control circuit U14 includes: a fourth comparator U20; a first input end of the fourth comparator U20 receives the OPAMP output level OUT1 outputted by the output end of the operational amplifier U30, a second input end of the fourth comparator U20 receives a comparison level V4 which is lower than the maximum value by a certain value (the comparison level V4 may be slightly lower than the maximum value to which the OPAMP output level OUT1 can be pulled up and higher than the OPAMP output level OUT1 in the voltage regulation state), and an output end of the fourth comparator U20 outputs a second comparison output level; when the OPAMP output level OUT1 is the maximum value, the second comparison output level is low, and when the OPAMP output level OUT1 is pulled down for regulation, the second comparison output level is high; a first trigger U22, wherein the first trigger U22 receives a negating signal NGATE of an output control signal of the threshold comparison circuit U10 and the second comparison output level outputted by the fourth comparator U20, and the negating signal NGATE can be obtained by receiving the output of an OR circuit U21 of the output control signal GATE of the threshold comparison circuit U10; a charging-discharging circuit, wherein when the negating signal NGATE of the output control signal of the threshold comparison circuit U10 is low and the second comparison output level is high, an output signal of the first trigger U22 controls the charging-discharging circuit to perform charging; when the negating signal NGATE of the output control signal of the threshold comparison circuit U10 is high, the charging-discharging circuit is controlled to perform discharging; and a fifth comparator U23, wherein a first input end of the fifth comparator U23 receives a charging-discharging voltage VC1 of the charging-discharging circuit, a second input end of the fifth comparator U23 receives a preset level V5 of the voltage regulation time, and an output end of the fifth comparator U23 outputs a third comparison output level V6; the time when the charging-discharging voltage VC1 begins from the initial state to the preset level V5 of the voltage regulation time is the time of the voltage regulation state, wherein when the charging-discharging voltage VC1 is higher than the preset level V5 of the voltage regulation time, the third comparison output level V6 controls the dynamic voltage regulation circuit U16 to raise the preset voltage regulation reference value; and when the charging-discharging voltage VC1 is lower than the preset level V5 of the voltage regulation time, the third comparison output level V6 controls the dynamic voltage regulation circuit U16 to lower the preset voltage regulation reference value.

Preferably, the dynamic voltage regulation circuit U16 includes: a second trigger U24, wherein the reset terminal of the second trigger U24 receives the negated signal NGATE of the output control signal of the threshold comparison circuit U10, and the setting terminal of the second trigger U24 receives the third comparison output level V6 outputted by the fifth comparator U23; a first pulse generation circuit U26, wherein an input end of the first pulse generation circuit U26 is connected with the output terminal of the second trigger U24, and a first trigger pulse is outputted when the output of the output terminal of the second trigger U24 is high; an AND gate U25, a first input end of the AND gate U25 is connected with a negated output end of the second trigger U24, and the second input end of the AND gate U25 receives the negated signal NGATE of the output control signal of the threshold comparison circuit U10; a second pulse generation circuit U27, wherein an input end of the second pulse generation circuit U27 is connected with the output end of the AND gate U25, a second trigger pulse is outputted when the output end of the AND gate U25 is at a high level; a first switch K22, a first current source I21, a second switch K23, a second current source I22 and a first shared capacitor C21, the first current source I21 and the second current source I22 are connected in series, the series connection point is connected with one end of the first shared capacitor C21 and the series connection point is used as the output end of the preset voltage regulation reference value V2, and the other end of the first shared capacitor C21 is grounded; the first switch K22 is controlled to be turned on by the first trigger pulse of the first pulse generation circuit U26, such that a current of the first current source I21 flows through the first shared capacitor C21 to raise the preset voltage regulation reference value V2; and the second switch K23 is controlled to be turned on by the second trigger pulse so that a current of the second current source I22 flows through the second shared capacitor C21 to lower the preset voltage regulation reference value V2.

Optionally, the charging-discharging circuit of the voltage regulation control circuit U14 includes: a third switch K21, a third current source I20, a fourth switch K20, and a second shared capacitor C20. The third switch K21 and the third current source I20 are connected in series, the third switch K21 and the third current source I20 are also connected with a first end of the second shared capacitor C20, the connection point outputs the charging-discharging voltage VC1, a second end of the second shared capacitor C20 is grounded, and the fourth switch K20 is connected in parallel with the second shared capacitor C20; the third switch K21 is controlled by an output signal of the first trigger RS, thereby conducting charging when the current of the third current source I20 flows through the second shared capacitor C20 when turned on; and the fourth switch K20 is controlled by the negated signal NGATE of the output control signal of the threshold comparison circuit U10 to make the second shared capacitor C20 discharge when turned on.

When the voltage of the output control signal GATE of the threshold comparison circuit U10 is zero, that is, when the synchronous rectification transistor is turned off, the negated signal NGATE of the output control signal GATE of the threshold comparison circuit U10 controls the fourth switch K20 to turn on and the charging-discharging voltage VC1 of the second shared capacitor C20 is reset to zero. When the voltage of the output control signal GATE of the threshold comparison circuit U10 is high, that is, when the synchronous rectification transistor is turned on, the fourth switch K20 is turned off.

Referring to FIG. 5, more specifically, in one embodiment, both the first trigger and the second trigger are RS triggers. The comparison level V4 is lower than the maximum value of the OPAMP output level OUT1 by a certain value. Comparing the OPAMP output level OUT1 to the comparison level V4, when the output level OUT1 is the maximum value, the output of the operational amplifier U20 is low, the output terminal Q of the RS trigger U22 is zero, the third switch K21 is turned off, and the charging-discharging voltage VC1 is still zero. When the voltage of the drive signal DRV is in the regulation state, that is the OPAMP output level OUT1 is not the highest voltage, the output of the fourth comparator U20 is high, the output terminal Q of the RS trigger U22 is high, the third switch K21 is turned on, the third current source I20 charges the second shared capacitor C20, and the charging-discharging voltage VC1 rises linearly. The time when the charging-discharging voltage VC1 rises up to the preset level V5 is the preset value T3 of the drive signal DRV in the voltage regulation state. When the charging-discharging voltage VC1 exceeds the preset level V5 of the voltage regulation time, this indicates that the time Ta when the drive signal DRV is in the voltage regulation state is bigger than the preset value T3, that is, the output of the fifth comparator U23 is high; and when the charging-discharging voltage VC1 in the output control signal GATE of the threshold comparison circuit U10 is zero and does not exceed the preset level V5 of the voltage regulation time all the time, this indicates that the time Ta when the drive signal DRV is in the voltage regulation state is smaller than the preset value T3, that is, the output of the fifth comparator U23 is always low during the period when GATE is high. The RS trigger U24 is reset when the output control signal GATE of the threshold comparison circuit U10 is low. That is, Q is zero, and $\overline{Q}$ is high. When the output control signal GATE of the threshold comparison circuit U10 is high, the RS trigger U24 is set, the output Q is high, and $\overline{Q}$ low. The output terminal Q of the RS trigger U24 is connected to the first pulse generation circuit U26. When the output of the RS trigger U24 is high, the first pulse generation circuit U26 generates a first pulse with a certain width, the first pulse causes the first switch K22 to turn on so that the preset voltage regulation reference value V2 rises, which can shorten the time Ta when the drive signal DRV is in the voltage regulation state. The output of the comparator U23 is always low during the period when the output control signal GATE of the threshold comparison circuit U10 is high, while when the output control signal GATE of the threshold comparison circuit U10 is low, the output terminal $\overline{Q}$ of the RS trigger U24 is high, that is, the output end of the AND gate U25 is high. The output end of the AND gate U25 is connected to the second pulse generation circuit U27. When the output of the AND gate U25 is high, the second pulse generation circuit U27 generates a second pulse with a certain width. The second pulse causes the second switch K23 to turn on, such that the preset voltage regulation reference value V2 decreases, thereby lengthening the time Ta when the drive signal DRV is in the voltage regulation state. The preset voltage regulation reference value V2 is regulated by the dynamic regulation voltage circuit U16, such that the time Ta when the drive signal DRV is in the voltage regulation state is equal to the preset value T3.

Figure 6:
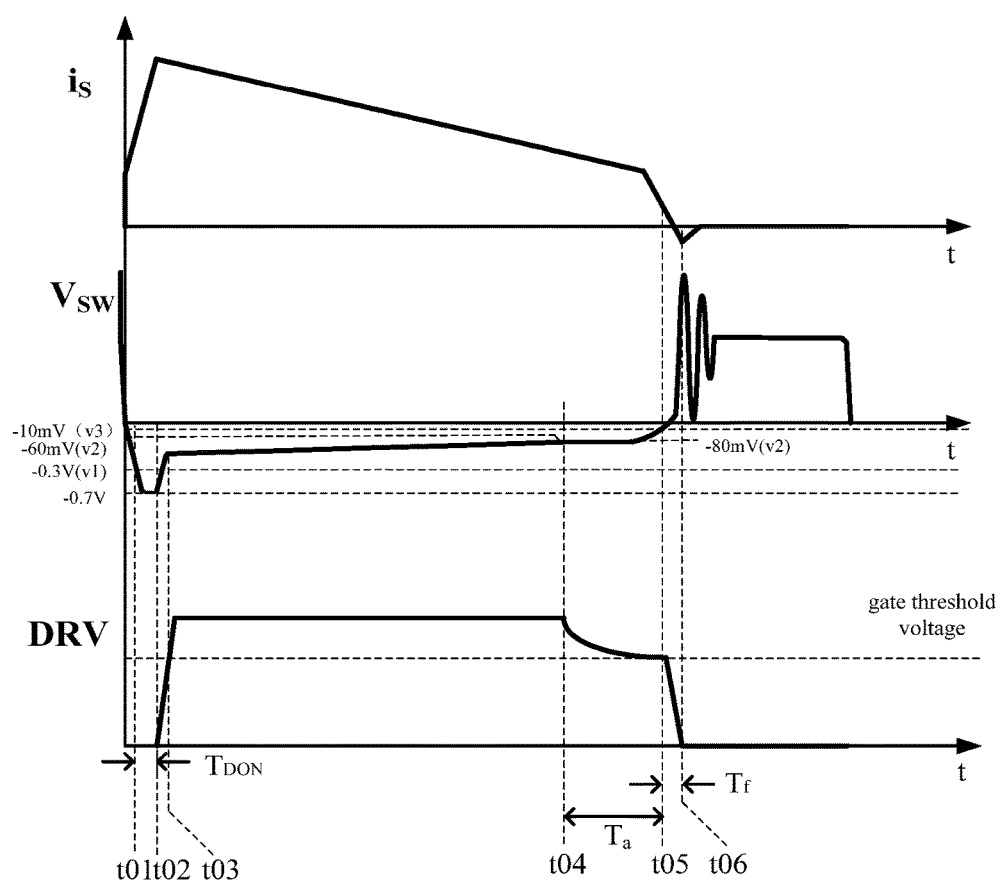
FIG. 6 is a schematic diagram illustrating a waveform of a drive signal of a synchronous rectification transistor according to an embodiment of the present invention.

In the flyback circuit, taking the waveform generated by the switching circuit in which the diode at the secondary side is replaced by the synchronous rectification transistor as an example, the switching circuit can be the circuit configuration as shown in FIG. 3. The waveforms of the secondary side current $i_S$, the drain-source voltage $V_{SW}$, the drive signal DRV of the synchronous rectification transistor are shown in FIG. 6. In FIG. 6, take V1=−300 mV, V21=−60 mV, and V3=−10 mV as an example. When the main switching tube M20 is turned off, the freewheeling diode continues the flow, the drive signal DRV is low, the synchronous rectification transistor M21 is turned off, the secondary side current $i_S$ rises, the drain-source voltage $V_{SW}$ voltage drops, and the current flows through the parasitic diode or the external diode. At the time t01, when the drain-source voltage $V_{SW}$ drops to −300 mV, the output of the RS trigger changes from low to high. As the drive circuit U15 has a certain delay which takes about tens of nanoseconds, the output of the drive circuit U15 begins to rise until the time t02. At the time t03, the voltage of the drive signal DRV reaches the turn-on threshold value thereof, the synchronous rectification transistor M21 is turned on, and the drain-source voltage $V_{SW}$ rises. In t03-t04, as the drain-source voltage $V_{SW}$ is below −60 mV, the voltage of the drive signal DRV is at its highest voltage. At the time t04, the preset voltage regulation reference value V2 is reduced from −60 mV to −80 mV to make the voltage of the drive signal DRV in the voltage regulation state, and the voltage of the drive signal DRV drops. Between the time t04-t05, as the main switching tube M20 at the primary side is turned on, the secondary side current $i_S$ decreases rapidly, a turning point of the secondary side current is appears, and the drain-source voltage $V_{SW}$ rises rapidly. At the time t05, when the drain-source voltage $V_{SW}$ is raised up to −10 mV, the voltage of the drive signal DRV begins to be pulled down. Since the voltage of the drive signal DRV has been already in the regulation state before t05 and is very close to the gate turn-off threshold voltage, the synchronous rectification transistor M21 is turned off as soon as the voltage of the drive signal DRV is pulled down. At the time t06, the voltage of the drive signal DRV is pulled down to zero, such that the synchronous rectification transistor M21 can be quickly turned off to prevent the synchronous rectification transistor M21 from being turned on with the main switching tube M20 simultaneously.

This prevention further provides a synchronous rectification control method for controlling the switching circuit having the synchronous rectification transistor, and the control method includes the following steps:

collecting the drain-source voltage of the synchronous rectification transistor;

comparing the drain-source voltage to the preset low threshold voltage and controlling the drive circuit to output the pull-up drive signal to turn on the synchronous rectification transistor when the drain-source voltage is lower than the preset low threshold voltage;

comparing the drain-source voltage to the preset voltage regulation reference value, controlling the drive circuit to output the pull-up drive signal for pulling up the drain-source voltage when the drain-source voltage is lower than the preset voltage regulation reference value and when the drain-source voltage is higher than the preset voltage regulation reference value and lower than the preset high threshold voltage, controlling the drive circuit to enter the voltage regulation state, regulating the voltage of the drive signal and outputting the drive signal after being voltage regulated, such that the drain-source voltage is stable at the preset voltage reference value or around the preset voltage regulation reference value; and comparing the drain-source voltage to the preset high threshold voltage and controlling the drive circuit to output the pull-down drive signal to turn off the synchronous rectification transistor when the drain-source voltage is higher than the preset high threshold voltage.

The preset voltage regulation reference value V2 can be preset, and the value can be set to allow the voltage of the drive signal DRV to be around the gate turn-off threshold voltage before the turn-off. For example, the value may be −60 mV. However, this is just an example.

In one embodiment, the synchronous rectification control method further includes lowering the preset voltage regulation reference value if the drive circuit does not enter the voltage regulation state when the turn-on time of the synchronous rectification transistor is controlled to reach a certain value or within a certain period before the synchronous rectification transistor is turned off.

Preferably, the previous turn-on time T1 of the synchronous rectification transistor is recorded, and when the turn-on time of the synchronous rectification transistor is controlled to reach N*T1, if the drive circuit does not enter the voltage regulation state, the preset voltage regulation reference value is lowered, wherein N is a percentage value.

In another embodiment, the synchronous rectification control method further includes: detecting the time when the drive circuit is in the voltage regulation state and regulating the preset voltage regulation reference value to make the time when the drive circuit is in the voltage regulation state be a certain value.

The specific contents of the synchronous rectification control method in the present invention can refer to the description of the aforementioned specific embodiments of the synchronous rectification control circuit, which is not described herein for a concise purpose.

The present invention also provides a flyback switching circuit, including the synchronous rectification control circuit described in any one of the preceding embodiments or configured to use the synchronous rectification control method as described in any one of the preceding embodiments, referring to the details in the corresponding description of the preceding embodiments.

Although the present invention has been described in considerable detail with reference to the preferred embodiments as above, the disclosure is not for limiting the claims. Persons having ordinary skills in the art may make various modifications and changes without departing from the scope and spirit of the invention. Therefore, the protection scope of the invention shall be confined to what is claimed.

What is claimed is:

1. A synchronous rectification control circuit, for controlling a switching circuit having a synchronous rectification transistor, the control circuit comprising:
   a drive circuit, an output end thereof being connected with a driving end of the synchronous rectification transistor, the drive circuit outputting a drive signal to control turn-on and turn-off of the synchronous rectification transistor;
   a threshold comparison circuit, an input end thereof receiving a drain-source voltage of the synchronous rectification transistor, and wherein when the drain-source voltage is lower than a preset low threshold voltage, a pull-up drive signal is outputted to turn on the synchronous rectification transistor; and when the drain-source voltage is higher than or equal to a preset high threshold voltage, the drive circuit is controlled to output a pull-down drive signal to turn off the synchronous rectification transistor; and
   a voltage regulation control circuit, collecting the drain-source voltage of the synchronous rectification transistor and comparing the drain-source voltage to a preset voltage regulation reference value, wherein when the drain-source voltage is lower than the preset voltage regulation reference value, the drive circuit is controlled to output a drive signal for pulling up a voltage of the drive signal to a preset pull-up voltage high value, and when the drain-source voltage is higher than or equal to the preset voltage regulation reference value and lower than the preset high threshold voltage, the drive circuit is controlled to enter a voltage regulation state, a voltage of the drive signal is regulated, and the drive signal after being voltage regulated is outputted, such that the drain-source voltage is stable at the preset voltage regulation reference value or around the preset voltage regulation reference value;
   wherein when turn-on time of the synchronous rectification transistor reaches a certain value or within a certain period before the synchronous rectification transistor is turned off, if the drive circuit does not enter the voltage regulation state, the voltage regulation control circuit outputs a dynamic regulation signal;
   wherein the control circuit further comprises a dynamic voltage regulation circuit connected with the voltage regulation control circuit; and
   wherein receiving and responding to the dynamic regulation signal outputted by the voltage regulation control circuit, the dynamic voltage regulation circuit regulates the preset voltage regulation reference value and outputs the preset voltage regulation reference value after being regulated to the voltage regulation control circuit.

2. The synchronous rectification control circuit of claim 1, wherein the voltage regulation control circuit comprising a recording module for recording a previous turn-on time T1 of the synchronous rectification transistor, and when the turn-on time of the synchronous rectification transistor is controlled to reach N*T1, if the drive circuit does not enter the voltage regulation state, the dynamic regulation signal is outputted, wherein N is a percentage value.

3. The synchronous rectification control circuit of claim 1, wherein the voltage regulation control circuit comprises a detection module for detecting time when the drive circuit is in the voltage regulation state.

4. The synchronous rectification control circuit of claim 3, further comprising a dynamic voltage regulation circuit connected with the voltage regulation control circuit, and according to the time when the drive circuit is in the voltage regulation state obtained by the detection module, the dynamic voltage regulation circuit regulating the preset voltage regulation reference value to make the time when the drive circuit is in the voltage regulation state equal to or close to a certain value.

5. The synchronous rectification control circuit of claim 1, the threshold comparison circuit comprising:
   a first comparator, a negative input end of the first comparator receiving the drain-source voltage outputted by the voltage regulation control circuit, a positive input end of the first comparator being inputted with the preset low threshold voltage, and an output end of the first comparator outputting a first comparison signal;
   a second comparator, a positive input end of the second comparator receiving the drain-source voltage outputted by the voltage regulation control circuit, a negative input end of the second comparator being inputted with the preset high threshold voltage, and an output end of the second comparator outputting a second comparison signal; and
   a trigger, receiving the first comparison signal and the second comparison signal, outputting a first control signal and controlling the drive circuit to output the pull-up drive signal when the first comparison signal is at a high level, and outputting a second control signal and controlling the drive circuit to output the pull-down drive signal when the second comparison signal is at a high level.

6. A flyback switching circuit comprising the synchronous rectification control circuit according to claim 1.

7. A flyback switching circuit comprising the synchronous rectification control circuit according to claim 2.

8. A flyback switching circuit comprising the synchronous rectification control circuit according to claim 3.

9. A flyback switching circuit comprising the synchronous rectification control circuit according to claim 4.

10. A flyback switching circuit comprising the synchronous rectification control circuit according to claim 5.

* * * * *